US006310339B1

(12) United States Patent
Hsu et al.

(10) Patent No.: US 6,310,339 B1
(45) Date of Patent: Oct. 30, 2001

(54) OPTICALLY CONTROLLED MEM SWITCHES

(75) Inventors: Tsung-Yuan Hsu, Westlake Village; Robert Y. Loo, Agoura Hills; Greg Tangonan, Oxnard; Juan F. Lam, Manhattan Beach, all of CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/429,234

(22) Filed: Oct. 28, 1999

(51) Int. Cl.[7] ...................................................... H01L 31/00

(52) U.S. Cl. ................................ 250/214.1; 250/214 LS; 200/181

(58) Field of Search ............................ 250/227.22, 214.1, 250/214 LS, 214 SW, 206; 200/184, 181, 61.02; 343/876, 878, 906

(56) References Cited

U.S. PATENT DOCUMENTS

| | | | | |
|---|---|---|---|---|
| 4,160,141 | * | 7/1979 | Graf | 200/187 |
| 4,922,253 | | 5/1990 | Nathanson et al. | 342/5 |
| 5,121,089 | | 6/1992 | Larson | 333/107 |
| 5,541,614 | | 7/1996 | Lam et al. | 343/792.5 |

FOREIGN PATENT DOCUMENTS 0 484 142 5/1992 (EP) .

OTHER PUBLICATIONS

Larson, L.E., et al., "Microactuators for GaAs–based Microwave Integrated Circuits," *IEEE* (1991), pp. 743–746. (Month unknown).

* cited by examiner

*Primary Examiner*—Que T. Le
(74) *Attorney, Agent, or Firm*—Ladas & Parry

(57) ABSTRACT

An optically controlled micro-electromechanical (MEM) switch is described which desirably utilizes photoconductive properties of a semiconductive substrate upon which MEM switches are fabricated. In one embodiment the bias voltage provided for actuation of the switch is altered by illuminating an optoelectric portion of the switch to deactivate the switch. In an alternative embodiment, a photovoltaic device provides voltage to actuate the switch without any bias lines at all. Due to the hysteresis of the electromechanical switching as a function of applied voltage, only modest variation of voltage applied to the switch is necessary to cause the switch to open or close sharply under optical control.

20 Claims, 5 Drawing Sheets

OPTICALLY CONTROLLED MEM SWITCHES

FIELD OF THE INVENTION

The present invention pertains to microfabricated electromechanical (MEM) switches which may be fabricated on a substrate.

BACKGROUND

MEM switches in various forms are well-known in the art. U.S. Pat. No. 5,121,089 to Larson, granted in 1992, describes an example of a MEM switch in which the armature rotates symmetrically about a post. Larson also suggested cantilevered beam MEM switches, in "Microactuators for GaAs—based microwave integrated circuits" by L. E. Larson et al., Journal of the Optical Society of America B, 10, 404–407 (1993).

MEM switches are very useful for controlling very high frequency lines, such as antenna feed lines and switches operating above 1 GHz, due to their relatively low insertion loss and high isolation value at these frequencies. Therefore, they are particularly useful for controlling high frequency antennas, as is taught by U.S. Pat. No. 5,541,614 to Lam et al. (1996). Such use generally requires an array of MEM switches, and an N×N array of MEM switches requires $N^2+1$ output lines and $N^2$ control circuits for direct electrical control. These control lines may need to be shielded to avoid interfering with the high frequency antenna lines, and accordingly add considerable complexity and cost to the fabrication of these switches.

Thus, there exists a need for controlling the MEM switches in such an array by a means which reduces the difficulties imposed by routing control lines.

SUMMARY OF THE INVENTION

The present invention alleviates the above-noted problem of providing control lines for an array MEM switches, and provides other benefits as well. In particular, it provides a mechanism for controlling MEM switches with light, with attendant benefits such as isolation, and indeed remoteness, from a controlling light source.

The present invention provides optical control of MEM switches. In a preferred embodiment, two DC bias lines are provided to the vicinity of each MEM switch. On-off control of the switch is then effected by focusing light on the switch substrate. Under illumination, the photo-conductive nature of the semi-insulated substrate causes voltage loss in a series bias resistor to reduce the DC bias voltage applied to the switch. The switches may be used in combination to control an antenna array. Another embodiment of the invention employs a photovoltaic device to provide actuating voltage under illumination, thus obviating all bias lines.

DESCRIPTION OF THE PREFERRED EMBODIMENTS

Figure 1:
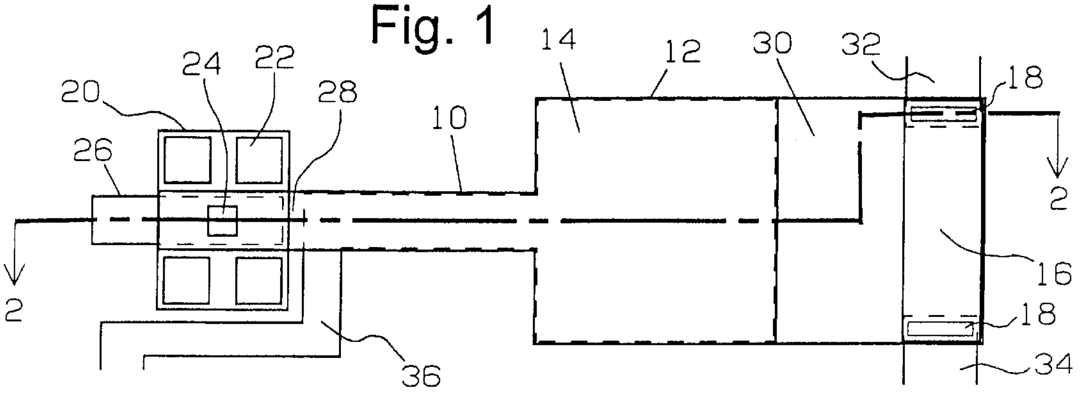
FIG. 1 is a top view of a MEM switch suitable for the present invention.

FIG. 1 shows a plan view of a preferred embodiment of an optically controlled MEM switch according to the present invention. Cantilever beam 10, preferably 24 microns wide, supports armature structure 12 which includes armature electrostatic plate 14, which is preferably about 100 microns square, and also switch conductor 16. A substrate electrostatic plate 40, not shown in this figure, is approximately the same size as armature electrostatic plate 14, and is positioned behind armature structure 12 in this top view and visible only as dotted lines. The width of switch conductor 16 depends on usage; shown proportionally to be about 30 microns, it may be narrower and in the preferred embodiment is 69 microns wide for a desirable high frequency impedance. Switch conductor 16 is insulated from armature electrostatic plate 14 by armature insulating region 30, which in the preferred embodiment is about 30 microns. Switch conductor 16 terminates at each end with contact dimples 18. Armature electrostatic plate 14 is connected to substrate armature pad 26 through cantilever beam conductor 28 and armature via 24. Anchor structure 20 attaches cantilever beam 10 to the substrate (not identified in FIG. 1) by means of four anchors, e.g. 22, plus armature via 24.

Signal "A" metallization 32 terminates below a first switch dimple 18 of armature structure 12, as shown in dashed lines. Signal "B" metallization 34 similarly terminates below a second switch dimple 18 of armature structure 12. Substrate electrostatic pad connection 36 conducts a common potential to substrate electrostatic pad 40 (designated in FIG. 2) which is disposed on the substrate below armature electrostatic pad 14 and indicated in FIG. 1 by dashed lines below armature electrostatic plate 14. When the switch is closed, Signal A is connected to Signal B through the switch dimples 18 and switch conductor 16.

Figure 2:
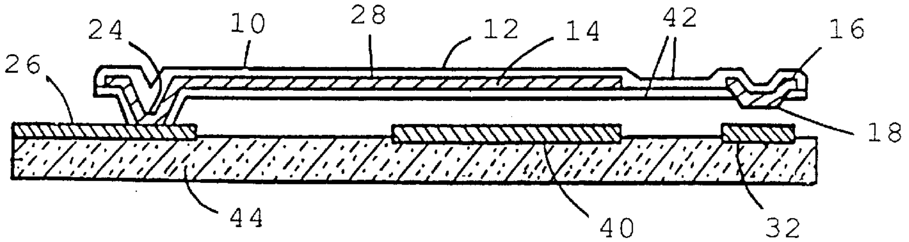
FIG. 2 is a lateral cross-sectional view of the MEM switch of FIG. 1, open.

FIG. 2 shows a section of the MEM switch of FIG. 1 taken along the indicated section line. In order to clarify the boundaries of substrate electrostatic plate 40, substrate electrostatic plate connection 36 is not shown where it extends below cantilever 10. Insulating layers 42 are disposed on the top and bottom of armature assembly 12 and support switch conductor 16. Lower and upper armature insulators 42 each have approximately equal differential stress with the armature metallization (e.g. 14, 28), and accordingly the differentials are balanced to minimize bowing of the armature. Plate 14 is connected to substrate armature pad 26 by cantilever beam conductor 28 and armature via 24. Switch conductor 16 is seen where it merges with dimple 18, which protrudes through the lower of armature insulations 42. The termination of Signal "A" connection 32 is seen disposed below switch connection dimple 18. Substrate 44 underlies all of this structure. Substrate 44 is preferably only about 100 microns thick, partly for purposes of signal line impedance control, but is not represented proportionally.

Figure 3:
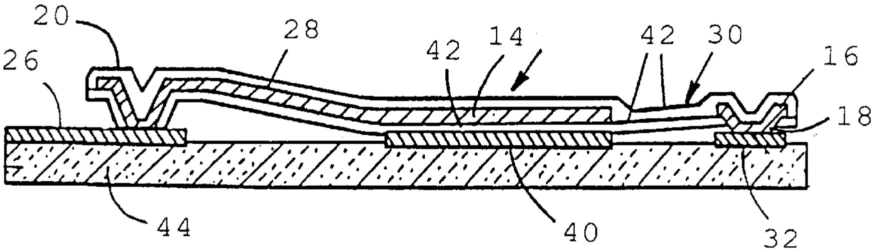
FIG. 3 is a lateral cross-sectional view of the MEM switch of FIG. 1, closed.

FIG. 3 shows the MEM switch section of FIG. 2, but in closed position. A voltage is applied between armature electrostatic plate 14 and substrate electrostatic plate 40. Armature structure 12 is drawn down toward substrate 44 by electrostatic force, and counterbalanced by the restoring spring force proportional to the displacement of cantilever beam 10. (The restoring spring force is provided by elastic resistance to deformation of armature conductor 28 plus upper and lower armature insulators 42; the armature structure is supported from substrate 44 by anchor structure 20). As the applied voltage continues to increase, the electrostatic force, which is proportional to the bias voltage and inversely proportional to the square of the gap between the two plates, will eventually exceed the restoring spring force of cantilever beam 10, and the balance cannot be maintained. At this so-called "snapdown" voltage, plate 14 snaps down and firmly rests on plate 40, such that as little as the lower armature insulation 42 may separate the plates. Insulating region 30 flexes somewhat, providing force so that dimple 18 presses firmly against signal "A" conductor 32, ensuring repeatable and reliable connection between them.

Figure 4:
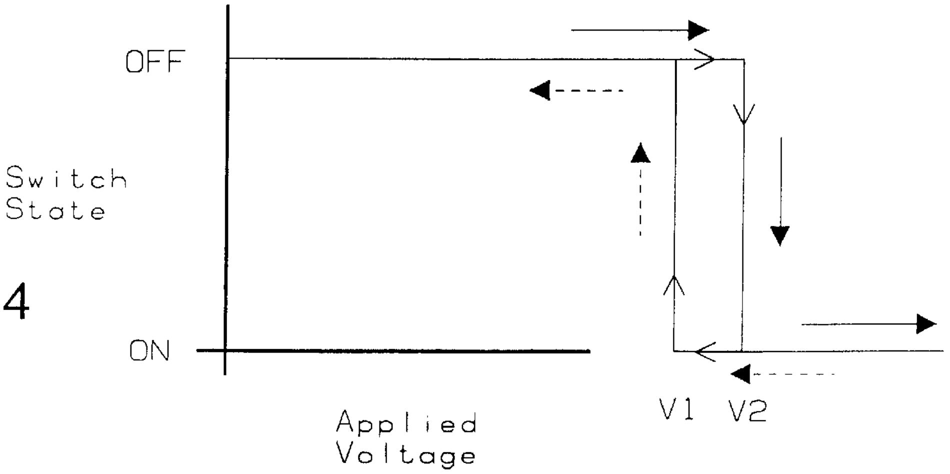
FIG. 4 shows the hysteresis of switch state as a function of applied voltage.

Hysteresis in the actuation of the switch is important to crisp functioning. FIG. 4 shows switch state as a function of applied voltage, which demonstrates the hysteresis characteristics of a typical RF MEM switch. As the applied voltage increases, the switch state will follow the path indicated by the arrows having solid-line shafts. Thus, the switch will turn from the "off" state to the "on" state as the applied voltage exceeds snap-down voltage V2. However, when the applied voltage has exceeded V2 and then is decreased, the switch state will follow the path indicated by the arrows having dashed-line shafts. Thus, the switch will not turn back to the "off" state as the applied bias voltage decreases to just below snap-down voltage V2, but rather will remain in the "on" state until the applied bias voltage drops to "hold-on" voltage V1. The switch then opens abruptly when the applied bias voltage drops just below hold-on voltage V1. The on-off differential, V2–V1, is typically a few volts; for example, in the preferred embodiment which has a snap-down voltage of 60 V, the on-off differential V2–V1 is 5V. The hysteresis of the switch actuation in response to applied voltage, along with the photo-conductive nature of the MEM switch described herein, are foundations of the present invention.

Figure 5:
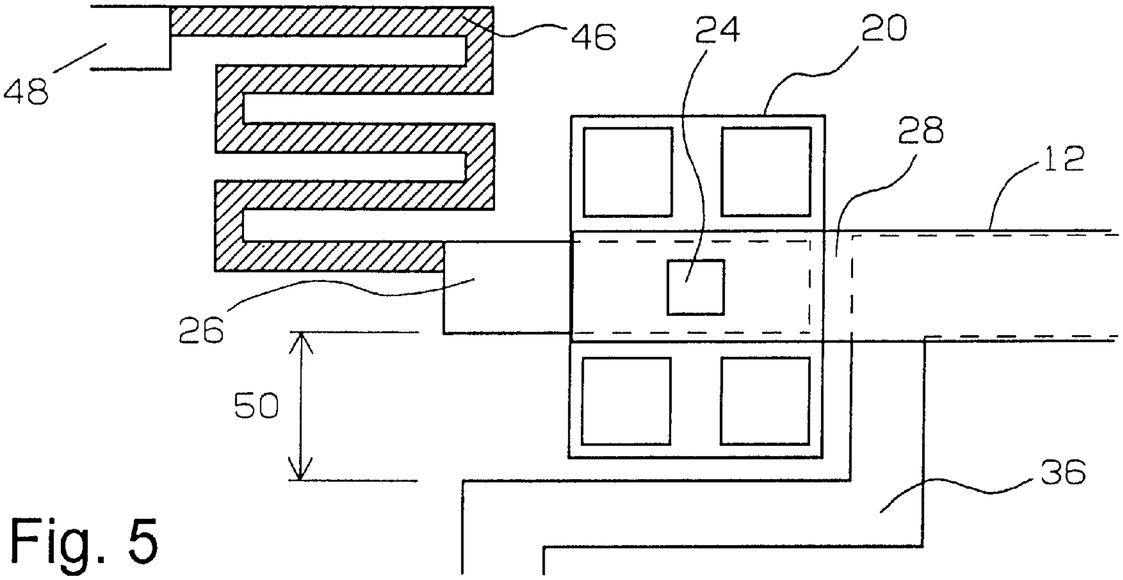
FIG. 5 shows details of the photoresistor area of FIG. 1.
Figure 6:
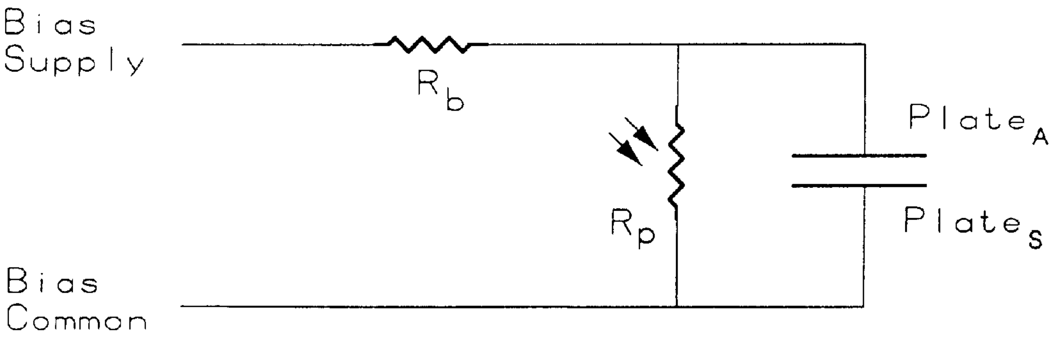
FIG. 6 is a schematic of application and control of bias voltage to the MEM switch.

FIG. 5 shows details which form the electrical components used in the preferred embodiment of the present invention, and may be more readily understood with reference to the electrical schematic shown in FIG. 6. In FIG. 6, Bias and Common are applied to exceed the snap-down voltage, preferably about 60V, and are provided by a bias supply (not shown). $R_b$ is a series bias resistor, preferably about 1 megohm. $R_p$ is a photoresistor, which is preferably simply part of the substrate. If $R_p$ is part of the substrate, then the substrate is preferably semi-insulating GaAs. When light is directed onto $R_p$, the resistance decreases from about 100 megohms to about 10 megohms. Consequently, the voltage available between $Plate_A$, the armature electrostatic plate, and $Plate_s$, the substrate electrostatic plate, varies depending upon the intensity of light directed upon $R_p$. In the preferred embodiment, 60V is applied to the switch when the substrate is dark, exceeding snap-down voltage and closing the MEM switch, while under strong illumination 54 V is applied, which is less than the hold-down voltage and thus opens the switch.

Returning to FIG. 5, bias is supplied to bias connection 48 from elsewhere, being common to all switches in an array. Bias resistor 46 is preferably 40 to 50 squares of sputtered CrSiO in a 6 micron line width, and conducts current from the bias source to armature substrate pad 26 through an appropriate resistance of preferably about 1 megohm. Bias resistor 46 is preferably covered with any non-conductive opaque material to prevent photoresistive effects from reducing its resistance. Current from the bias source is conducted from armature substrate pad 26 to the armature electrostatic pad, not shown, through armature via 24 of anchor structure 20, and through cantilever beam conductor 28, without further significant resistance. Bias supply Common (FIG. 6) may be provided to the substrate electrostatic plate, not shown, along substrate electrostatic connection 36, without significant resistance.

Semi-insulating GaAs substrate is preferably below all of the structure of FIG. 5. Illumination of the substrate reduces its resistance to very roughly 10 megohms per square. Accordingly, when illuminated the substrate in gap 50 between armature substrate pad 26 and substrate electrostatic connection 36 conducts sufficient current to reduce the voltage available between the armature and substrate electrostatic plates so that the switch opens.

SWITCH FABRICATION

FIGS. 7–10 show fabrication steps leading to the completed MEM switch shown in FIG. 2. Substrate 44 is preferably semi-insulating GaAs about 100 microns thick, and is chosen primarily for compatibility with the circuit in which the resulting MEM switch will be employed. Any semi-insulating substrate which exhibits a resistance varying under illumination by visible or infrared light may be used, which can be achieved using InP or Si, for example. Other substrates which do not inherently have photoconductive properties may also be used, such as ceramics or polyimides, but would require creation of a separate photoresistor. The thickness of the substrate is largely determined by requirements for the circuit, such as obtaining appropriate spacing from a ground plane for control of the transmission line characteristics of traces.

Figure 7:
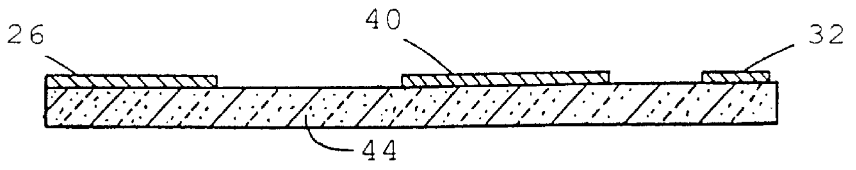
FIG. 7 shows the substrate with first metal layer in place.

In FIG. 7, metallization has been patterned upon substrate 44 to form armature substrate pad 26, substrate electrostatic plate 40, and Signal A conductor 32. Any technique may be employed to provide the patterned metallization, including for example lithographic resist lift-off or resist definition and metal etch, but also less common techniques. This metallization is preferably begun with about 250–500 Å of Ti to ensure adhesion to the substrate, followed by about 1000 Å of Pt to protect the Ti from diffusion of Au, and about 2000 Å of Au. Any compatible metallization may be employed, but will of course affect the properties of the completed MEM switch.

Figure 8:
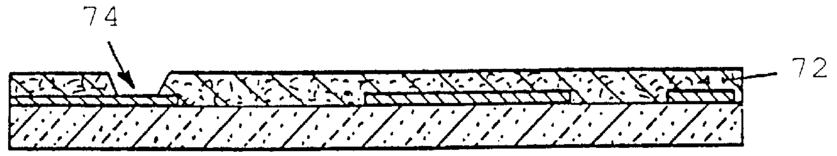
FIG. 8 is as FIG. 7 after selective addition of a sacrificial layer.

In FIG. 8, sacrificial support layer 72, preferably two micron thick $SiO_2$, is deposited using any compatible technique, such as plasma enhanced chemical vapor deposition (PECVD), or sputtering. The thickness of sacrificial support layer 72 affects the spacing of the electrostatic plates and the switch opening, which are both important design parameters. A via 74 is also formed through layer 72, which may be accomplished, for example, by means of lithographic photoresist and etch.

Figure 9:
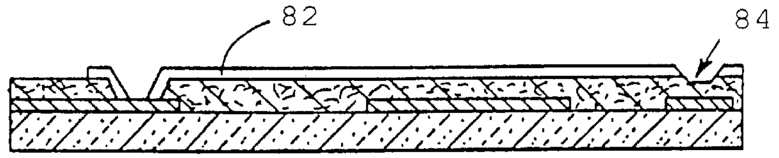
FIG. 9 shows selective addition of an insulating layer and etching of contact dimple.

In FIG. 9, the first armature structural layer 82 has been patterned. Structural layer 82 is preferably silicon nitride, but can also be other materials, desirably having a low etch rate compared to sacrificial layer 72. Via 84 may be formed by any technique, for example lithography and dry etch, but it is desirable that an etch step remove a portion of sacrificial layer 72 below via 84 to form a dimple receptacle extending a controlled depth below first structural layer 82.

Figure 10:
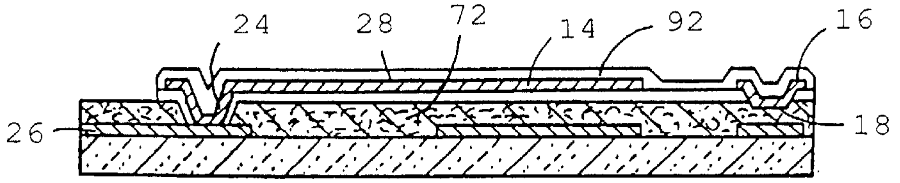
FIG. 10 shows addition of cantilever conductor metallization and final insulating layer.

FIG. 10 shows the result of two further steps. A second metallization pattern has been added to form dimple 18, switch conductor 16, armature electrostatic plate 14 and cantilever beam conductor 28, and it adheres to armature substrate pad 26 to form armature via 24. This metallization, typically sputter deposited, is preferably 200 Å of Ti followed by 1000 Å of Au (thinner than the metallization mentioned above), but of course alternative metals and thicknesses may be selected. FIG. 10 also shows second structural layer 92, added and patterned after the second metallization step. Second structural layer 92 is preferably the same material and thickness as first structural layer 82, described above with regard to FIG. 9, in order to balance the stresses within the armature and thereby minimize bowing of the armature.

To complete the MEM switch a further fabrication step of wet etching to remove sacrificial layer 72 is performed, which results in the switch as shown in FIG. 2. Sputter deposition of the bias resistor may be performed thereafter, as well as a step of opaquely coating the bias resistor if desired. It is also possible to deposit the bias resistor before the step of deposition of sacrificial layer 72. Indeed, if an opaque material is selected for sacrificial layer 72, then simply preventing etch of sacrificial layer 72 in the area of the bias resistor will protect the bias resistor from leakage due to illumination.

ADDITIONAL EMBODIMENTS

Figure 11:
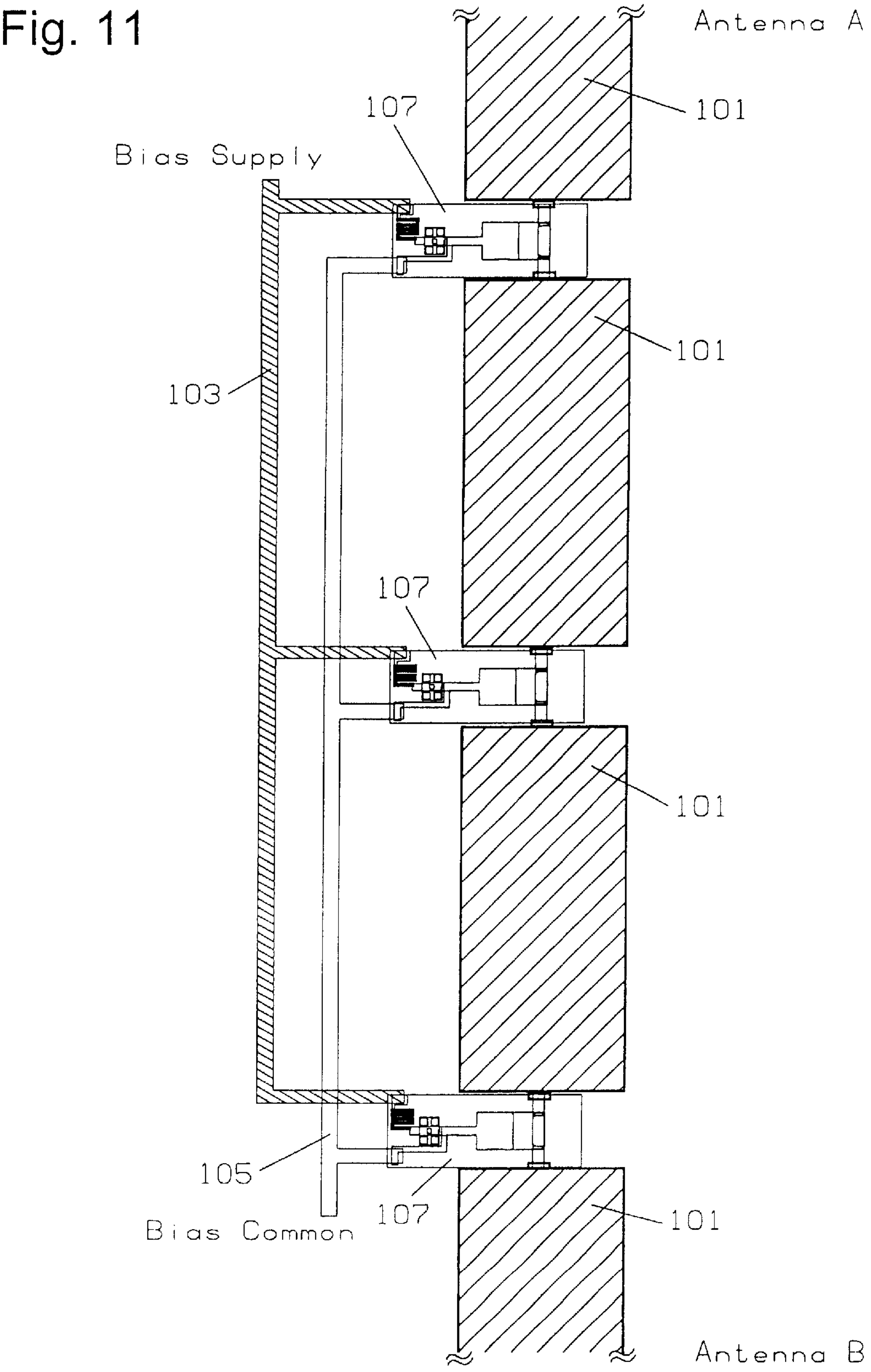
FIG. 11 shows an array of optically controlled MEM switches.

FIG. 11 shows an array of MEM switches according to the present invention for changing the characteristics of an antenna. The correct bias supply voltage is applied by connection 103 to each optically controlled MEM switch 107, which also has bias supply common 105 connected thereto. Each MEM switch 107 may be selectively illuminated by directing light at its photoelectric element individually, for example by means of an optical fiber mounted appropriately, such that antenna elements 101 are selectively connected. The antenna array may extend up toward Antenna A, or continue down toward Antenna B. The antenna elements can be varied widely to provide a finely tunable antenna.

Figure 12:
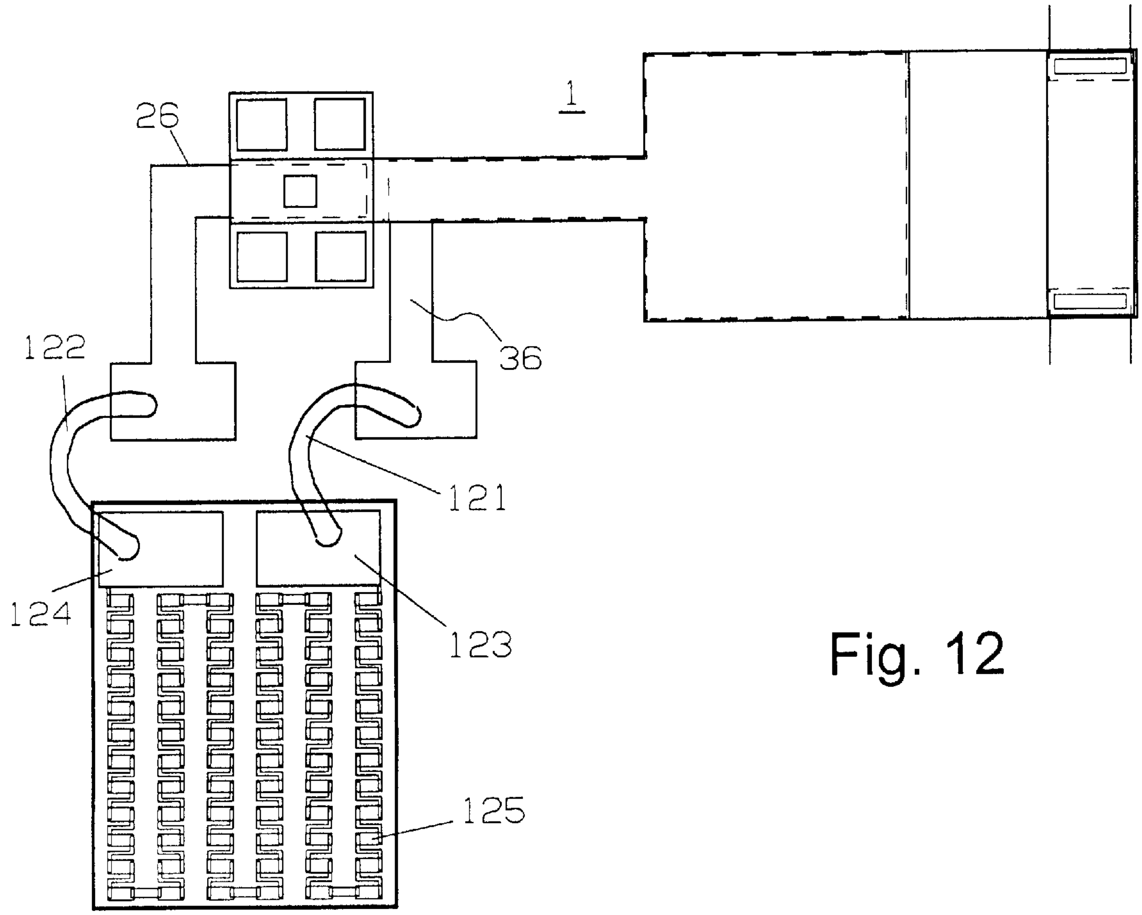
FIG. 12 shows a photovoltaically actuated MEM switch with no external bias lines.

FIG. 12 shows a MEM switch fabricated with a photovoltaic device 120 mounted along with MEM switch 1 to form a hybrid. Photovoltaic device 120 is a representative integrated circuit having seventy two individual photovoltaic cells, e.g. 125, connected in series, with the ends of the series of photovoltaic cells connected to bonding pads 123 and 124. Bond wire 121 connects the first bond pad 123 of photovoltaic device 120 to substrate electrostatic plate connection 36, and bond wire 122 connects the second bond pad 124 of photovoltaic device 120 to armature electrostatic plate connection 26. When illuminated, the photovoltaic device produces sufficient voltage to actuate the switch (greater than 60 V in the presently preferred embodiment), and thus no bias lines for MEM switch 1 need be connected to a bias supply or other external drive source, as is required for other embodiments. The hybrid fabrication shown in FIG. 12 is the presently preferred embodiment, and is compatible with virtually any surface upon which a MEM switch may be fabricated, so that the MEM switch may be fabricated upon a wide variety of substrate-like surfaces. However, a photovoltaic device may instead be fabricated into a substrate by appropriate processing. For example, Si or GaAs substrates can be processed to produce a photovoltaic device comprising many photovoltaic cells by steps which are well known in the art. MEM switch 1 may then be fabricated on the processed substrate as described above with regard to FIGS. 2 and 7–10 to form a completely integrated device. These devices, when used in an array, may also be selectively actuated by directing light at individual photovoltaic devices, such as through an optical fiber mounted above each photovoltaic device.

ALTERNATIVE EMBODIMENTS

It will be understood by those skilled in the art that the foregoing description is merely exemplary, and that an unlimited number of variations may be employed. In particular, the actuation (closing) voltage and dropout (opening) voltage of the MEM switch will depend upon the armature layer construction, the electrostatic plate sizes, the cantilever material, thickness, length and width, and the spacing between armature and substrate, to mention only a few variables, and thus the actuation voltage will vary widely between embodiments. The substrate photoresistor $R_p$ can be varied widely as well. This can be accomplished, for example, by changing the number of illuminated squares of substrate between the armature substrate pad connection and the substrate electrostatic pad connection, by varying impurities to alter the photoresistive effect, and by varying the intensity of the illumination. Moreover, alternative substrates are expected to provide an analogous photoresistive effect, or a different photoresistive material can be disposed on any substrate to provide the photoresistive effect. An unlimited number of different techniques and materials are available to provide a bias resistor $R_b$ of an appropriate value; in addition to the many possible variations of the presently preferred technique of applying a separate material patterned to form a resistor, many substrates can be made into high resistance traces through patterned implantation of impurities. The selected bias resistor $R_b$, along with the selected photoresistor $R_p$, causes the voltage available between the armature and substrate electrostatic plates to vary from above the actuation voltage to below the dropout voltage upon illumination of $R_p$ with a selected light source. Since all of these factors may be varied over a wide range, the invention is defined only by the accompanying claims.

What is claimed is:

1. An optically controlled mechanical switch actuated by electrostatic forces, the switch comprising:

electrostatic plates disposed on opposing portions of the switch to accumulate charge;

conductors to conduct charge to said electrostatic plates from a bias supply; and a photoelectric element having a photoresistive element arranged to affect a quantity of charge reaching said electrostatic plates from the bias supply such that the switch is caused to actuate to a first position when the photoresistive element is exposed to a first level of illumination, and to a second position when the photoresistive element is exposed to a different second level of illumination.

2. The optically controlled switch of claim 1 wherein the photoelectric element is a photoresistor.

3. The optically controlled switch of claim 2 wherein illumination of the photoresistor causes the switch to open.

4. The optically controlled switch of claim 1 wherein the photoelectric element is a photovoltaic cell.

5. An antenna array tunable by selective actuation of optically controlled switches according to claim 1.

6. The optically controlled switch of claim 2 wherein the photoelectric element exists within a substrate upon which the switch is fabricated.

7. A plurality of optically controlled switches according to claim 1, each of said plurality sharing a bias supply and a bias common, and each individually controllable by selective illumination.

8. A plurality of optically controlled switches according to claim 1, each of said plurality individually controllable by selective illumination without a need for a bias supply.

9. The optically controlled switch of claim 1 wherein the photoelectric element is formed in a region between metallization patterns of a substrate upon which the switch is fabricated.

10. The optically controlled switch of claim 9 wherein no processing of the substrate besides the deposition of the metallization is required to form the photoelectric element.

11. A method of controlling a mechanical switch, comprising the steps of:

providing electrostatic plates on opposing portions of the mechanical switch;

providing a source of charge for the electrostatic plates;

connecting a photoelectric element to affect the amount of charge provided to the electrostatic plates from the charge source;

illuminating the photoelectric element to a first level, thereby causing the switch to assume a first position; and illuminating the photoelectric element to a different second level, causing the switch to actuate to a different second position.

12. The method of claim 11 wherein the photoelectric element connected is a photoresistor.

13. The method of claim 12 comprising the further step of increasing illumination of the photoresistor to cause the switch to open.

14. The method of claim 11 wherein the photoelectric element connected is a photovoltaic cell.

15. A method of tuning an antenna array by selectively controlling mechanical switches as claimed in claim 11.

16. The method of claim 12 comprising the further step of forming the photoelectric element within a substrate upon which the switch is fabricated.

17. A method of controlling a plurality of optically controlled switches according to the method of claim 11, comprising the steps of:

providing a bias supply and a bias common to each one of said plurality of switches; and selectively illuminating the photoelectric element of each switch.

18. A method of controlling a plurality of optically controlled switches according to the method of claim 11 including the step of independently controlling the state of each particular optically controlled switch by selectively illuminating the photoelectric element of the particular switch, irrespective of voltages connected to devices other than the switch or the photoelectric element thereof.

19. The method of claim 11 including the steps of forming the photoelectric element in a region between metallization patterns of a substrate, and forming the photoelectric element upon said substrate.

20. The optically controlled switch of claim 19 wherein the step of forming the photoelectric element requires no processing of the substrate besides the deposition of the metallization.

* * * * *